United States Patent
Butendeich et al.

(10) Patent No.: US 10,446,723 B2
(45) Date of Patent: Oct. 15, 2019

(54) OPTOELECTRONIC ELEMENT AND OPTOELECTRONIC COMPONENT

(71) Applicant: OSRAM Opto Semiconductors GmbH, Regensburg (DE)

(72) Inventors: Rainer Butendeich, Sinzing (DE); Ion Stoll, Tegernheim (DE); Martin Mandl, Lappersdorf (DE); Martin Strassburg, Donaustauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/532,486

(22) PCT Filed: Dec. 2, 2015

(86) PCT No.: PCT/EP2015/078348
§ 371 (c)(1),
(2) Date: Jun. 1, 2017

(87) PCT Pub. No.: WO2016/087509
PCT Pub. Date: Jun. 9, 2016

(65) Prior Publication Data
US 2017/0365751 A1 Dec. 21, 2017

(30) Foreign Application Priority Data
Dec. 4, 2014 (DE) .................. 10 2014 117 892

(51) Int. Cl.
*H01L 33/50* (2010.01)
*H01L 33/08* (2010.01)
*H01L 33/18* (2010.01)

(52) U.S. Cl.
CPC ............. *H01L 33/505* (2013.01); *H01L 33/08* (2013.01); *H01L 33/18* (2013.01); *H01L 33/50* (2013.01); *H01L 33/504* (2013.01)

(58) Field of Classification Search
CPC ...... H01L 33/505; H01L 33/08; H01L 33/504
See application file for complete search history.

(56) References Cited

U.S. PATENT DOCUMENTS

2005/0092980 A1* 5/2005 Chen ..................... B82Y 20/00
257/14
2007/0228931 A1* 10/2007 Kim .................. C09K 11/7734
313/501

(Continued)

FOREIGN PATENT DOCUMENTS

DE 10351081 A1 6/2005
DE 102010051286 A1 5/2012

(Continued)

OTHER PUBLICATIONS

Mandl, Martin, et al., "Group III nitride core-shell nano- and microrods for optoelectronic applications", Physica Status Solidi RRL, Jul. 23, 2013, Wiley VCH Verlag GmbH & Co. KGaA, Weinheim, pp. 1-15.

*Primary Examiner* — Julia Slutsker
(74) *Attorney, Agent, or Firm* — McDermott Will & Emery LLP

(57) ABSTRACT

The invention relates to an optoelectronic element comprising a semiconductor chip (12) that emits a blue-green light (4) during operation and has at least one light passage surface (12*a*) through which the blue-green light (4) emitted during operation passes and comprising a conversion element (3) which comprises fluorescent particles (31), in particular fluorescent particles of only one type, and which is arranged on the light passage surface (12*a*) at least in some areas. The fluorescent particles (31) at least partly (Continued)

convert the blue-green light (4) into a red light (5), and the optoelectronic element emits a white mixed light (6) which contains non-converted components of the blue-green light (4) and components of the red light (5).

13 Claims, 7 Drawing Sheets

(56) References Cited

U.S. PATENT DOCUMENTS

| | | | |
|---|---|---|---|
| 2010/0051984 A1* | 3/2010 | West | H01L 33/44 |
| | | | 257/98 |
| 2010/0127282 A1* | 5/2010 | Harbers | H01L 22/12 |
| | | | 257/89 |
| 2010/0148200 A1* | 6/2010 | Lai | H01L 33/508 |
| | | | 257/98 |
| 2013/0240348 A1* | 9/2013 | Mi | H01L 31/03044 |
| | | | 204/157.5 |
| 2014/0117307 A1* | 5/2014 | Herner | H01L 33/0095 |
| | | | 257/13 |
| 2017/0236975 A1* | 8/2017 | Romano | H01L 33/18 |
| | | | 257/13 |

FOREIGN PATENT DOCUMENTS

| | | |
|---|---|---|
| DE | 102011078402 A1 | 1/2013 |
| DE | 102013110327 A1 | 11/2014 |
| DE | 102013114466 A1 | 6/2015 |

* cited by examiner

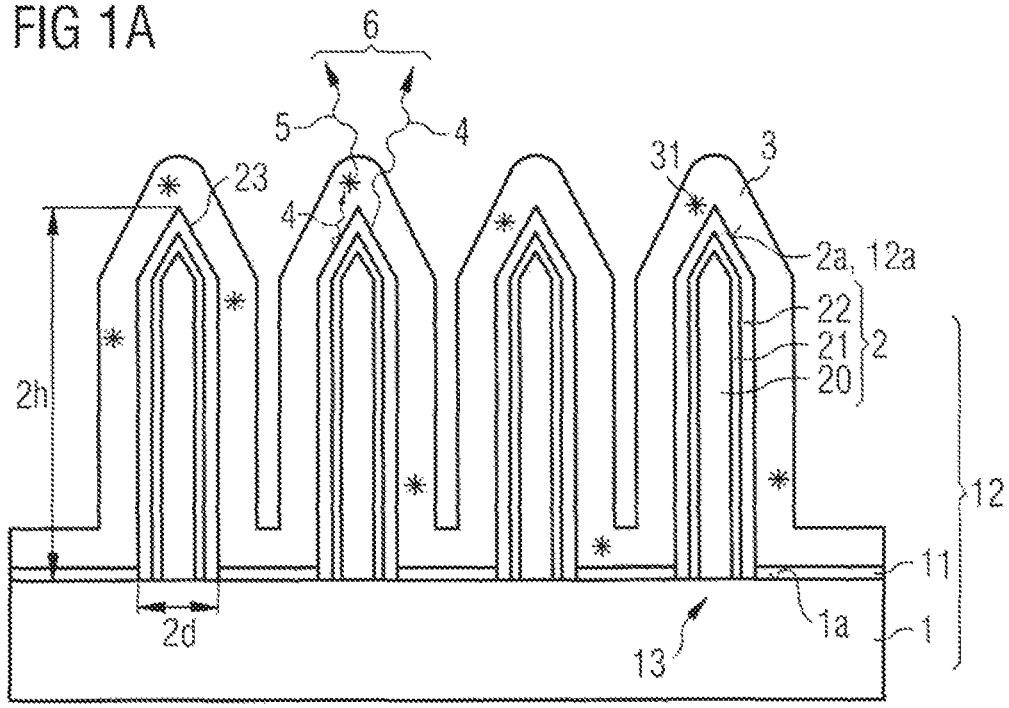
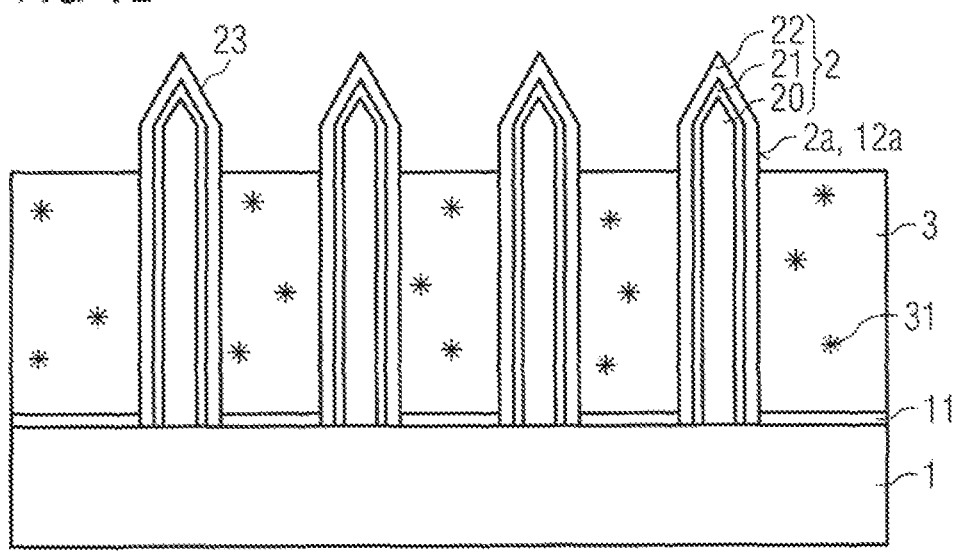

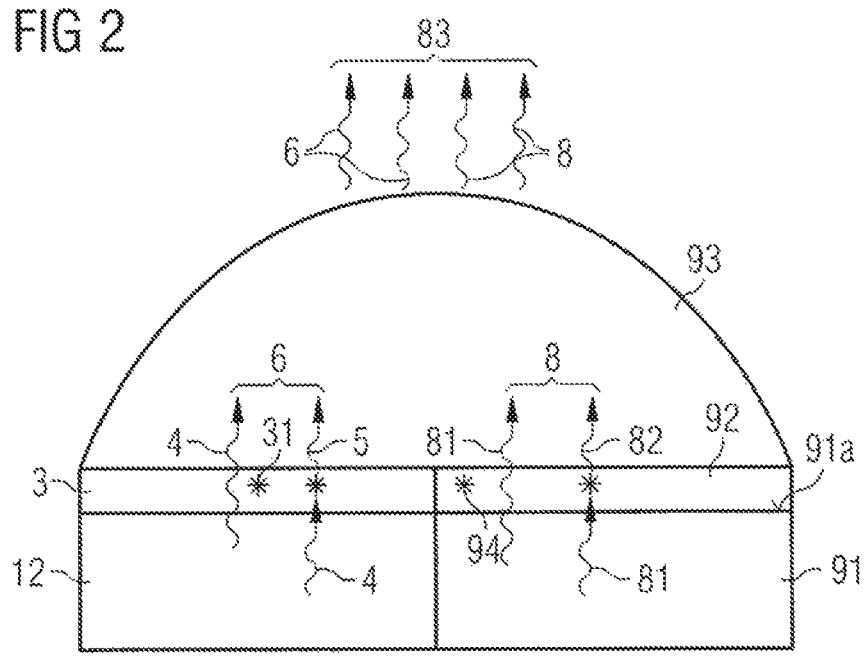

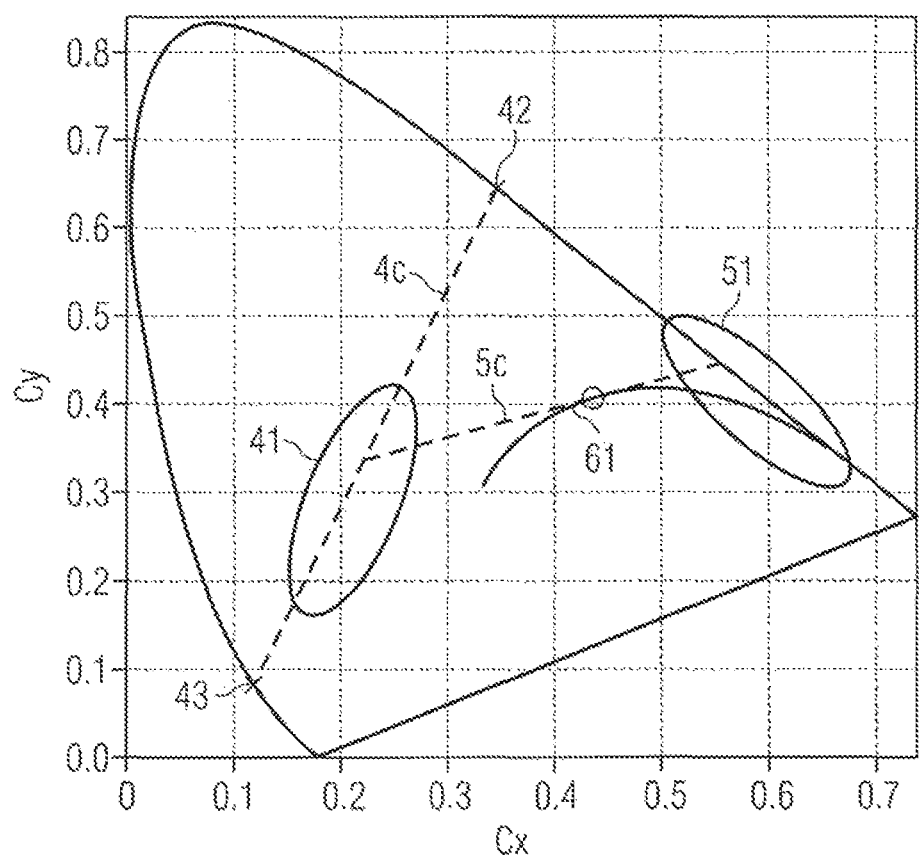

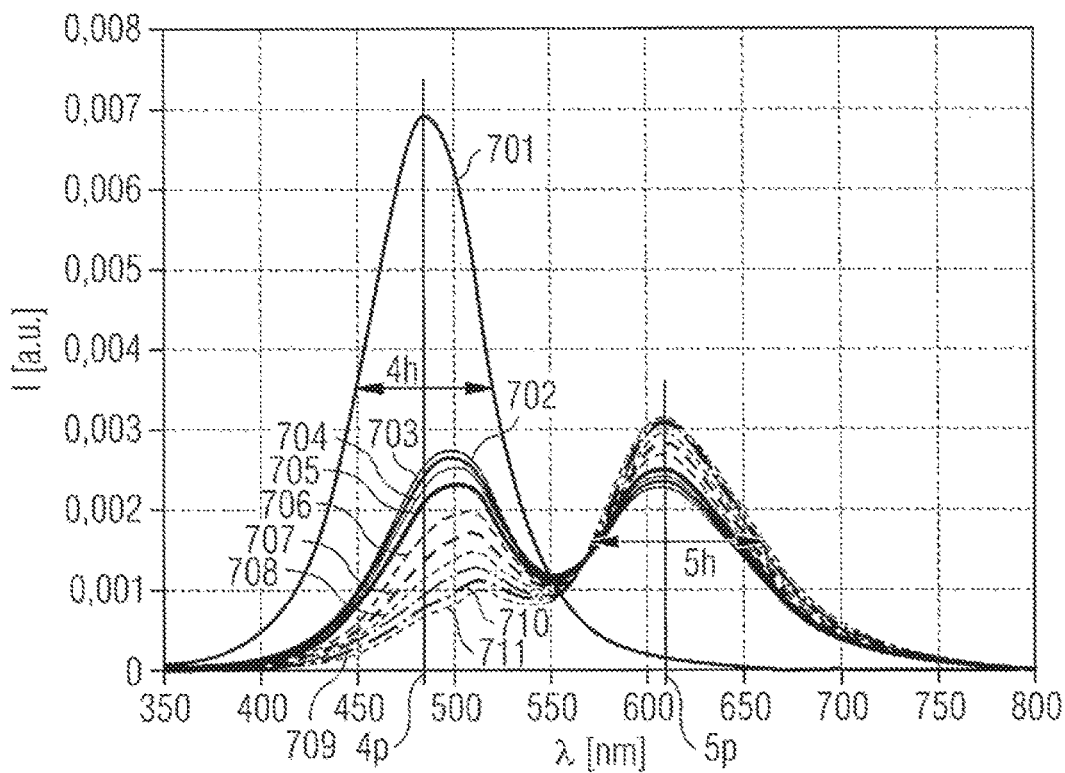

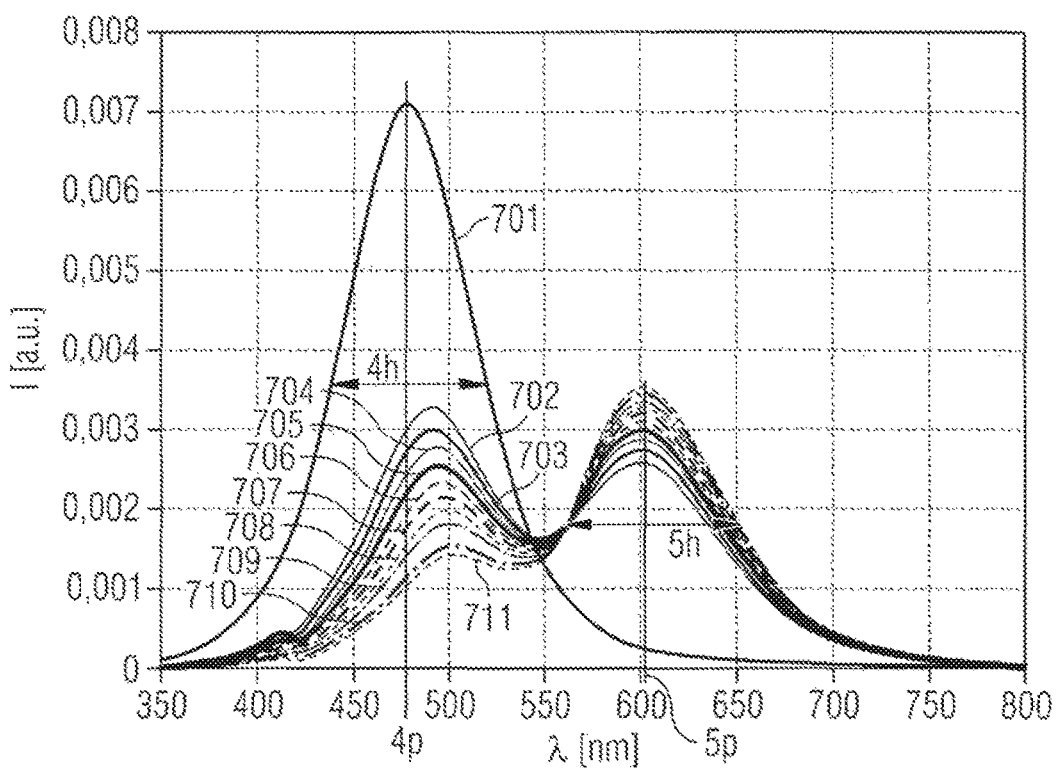

OPTOELECTRONIC ELEMENT AND OPTOELECTRONIC COMPONENT

The document DE 10 2011 078 402 A1 describes an optoelectronic element.

A problem to be solved consists in providing an optoelectronic element having improved spectral properties. A further problem to be solved consists in providing an optoelectronic component that emits light having a high color rendering index during operation.

An optoelectronic element is provided. The optoelectronic element is intended e.g. for the emission of light. The optoelectronic element can be e.g. a light-emitting diode (LED).

Per at least one embodiment of the optoelectronic element, this comprises a semiconductor chip. The semiconductor chip can be e.g. an LED chip. The semiconductor chip emits a blue-green light during operation. In other words, the semiconductor chip emits mint-colored light. In particular, the blue-green light has a spectrum that extends at least partly over the blue and the green spectral range. The spectrum of a light here and below is the spectral intensity distribution of the light, i.e. the intensity distribution as a function of the wavelength and/or frequency of the light. The blue spectral range here and below can lie within a range of at least 430 nm and no more than 490 nm, preferably at least 440 nm and no more than 480 nm. Furthermore, the green spectral range here and below can lie within a range of at least 490 nm and no more than 570 nm, preferably at least 500 nm and no more than 560 nm.

The semiconductor chip has at least one light passage surface, through which the blue-green light emitted by the semiconductor chip during operation passes. In particular the blue-green light is coupled out of the semiconductor chip through the light passage surface.

According to at least one embodiment of the optoelectronic element, this comprises a conversion element. The conversion element comprises fluorescent particles. The fluorescent particles are, for example, distributed spatially homogeneously in the conversion element. In particular, it is possible for the conversion element to comprise only one type of fluorescent particles within the limits of manufacturing tolerances. The term "within the limits of manufacturing tolerances" can mean in this context that a low concentration of other types of fluorescent particles may be present as a result of manufacturing, e.g. as impurities, but these have no effect on the conversion properties of the fluorescent particles. For example, the low concentration of the further types of fluorescent particles is no more than 5%, preferably no more than 1% and particularly preferably no more than 0.5% of the concentration of fluorescent particles.

The conversion element is arranged on the light passage surface of the semiconductor chip, at least in some places. In particular, the conversion element is arranged on the semiconductor chip in such a way that components of the blue-green light can be coupled into the conversion element during operation. For example, at least 80% of the light passage surface is covered by the conversion element.

According to at least one embodiment of the optoelectronic element, the fluorescent particles at least partially convert the blue-green light to a red light. The fluorescent particles are therefore wavelength-converting particles. In particular, fluorescent particles are intended to convert the wavelength of the light to be converted that impinges on them. Preferably, the converted light has a greater wavelength than the light to be converted. In particular, a photon of blue-green light hitting a fluorescent particle is converted within the fluorescent particle, e.g. by scattering, preferably inelastic scattering by means of absorption and re-emission, to a photon having a wavelength in the red range of the electromagnetic spectrum. In other words, when energetic excitation of the fluorescent particles occurs with blue-green light, the fluorescent particles emit red light.

According to at least one embodiment of the optoelectronic element, this emits a white mixed light during operation. The white mixed light contains non-converted components of blue-green light and components of the red light. Here and below, the term "component of a light" means either a component of the emitted intensity of the light or the total emitted intensity of said light. In particular, the mixed light can be formed from non-converted components of the blue-green light and all of the red light.

According to at least one embodiment of the optoelectronic element, this comprises a semiconductor chip which emits a blue-green light during operation and has at least one light passage surface, through which the blue-green light emitted during operation passes, and a conversion element which comprises fluorescent particles, in particular of only one type, and is arranged on the light passage surface at least in some places, wherein the fluorescent particles at least partly convert the blue-green light to a red light and the optoelectronic element emits a white mixed light, which contains non-converted components of the blue-green light and components of the red light.

With the optoelectronic element described herein, the idea being pursued is in particular to facilitate the generation of white, preferably of warm white, mixed light by using a semiconductor chip having a strongly unsaturated color locus in the blue-green spectral range. Here and below, the color locus belonging to a spectrum of a light is the point in a color space representing the color of the light. A color space can be represented as a color diagram, preferably as a CIE chromaticity diagram on the xy chromaticity plane, wherein the color locus can be unequivocally determined in the Cx and Cy coordinates. Cx here is the relative red part, while Cy is the relative green part of light.

Surprisingly, it has been shown that to generate white mixed light, in particular warm white mixed light with a color temperature of less than 4500 K, when using a blue-green emitter in particular only red-converting fluorescent particles, in particular of only one type, are required. The color temperature here and below is the temperature of a black body, of which the light impression most closely resembles that of the mixed light with the same brightness. Among other things, the use of only one type of red-converting fluorescent particles requires lower logistical effort to determine the concentrations of fluorescent particles in the conversion element needed in order to achieve the color locus of the mixed light to be generated. By comparison, it has been shown that it is not possible to provide warm white mixed light efficiently with only one phosphor using a blue light emitting semiconductor chip. This is a result of the small half-widths of the spectrum of blue light and of the light converted by fluorescent particles.

Furthermore, the selection of a blue-green emitter results in a better position in relation to the Planck curve in the color diagram. The Planck curve indicates the position of a black body with an associated temperature in the color diagram. This enables multiple color temperatures to be covered with just one type of phosphor.

According to at least one embodiment of the optoelectronic element, the semiconductor chip contains as active elements a plurality of nano- and/or microrods. These nano- and/or microrods are described in a different context, in particular in the publication "Group III nitride core-shell nano- and microrods for optoelectronic applications", published in Phys. Status Solidi RRL, 1-15 by Martin Mandl et al., the disclosure content of which is incorporated herein by reference.

The nano- and/or microrods each have a length and a width. The length is the maximum extension of the nano- and/or microrods along their main extension direction. The width is the maximum extension of the nano- and/or microrods perpendicular to the main extension direction. For example, the nano- and/or microrods are grown on a substrate. The main extension direction of the nano- and/or microrods can then run transversely, preferably vertically, to the substrate. The length can be at least 100 nm, preferably at least 1 μm, and no more than 100 μm, preferably no more than 20 μm. Furthermore, the width can be at least 50 nm, preferably at least 300 nm, and no more than 10 μm, preferably no more than 5 μm. In particular, the nano- and/or microrods can have a uniform width along all directions perpendicular to the main extension direction. An aspect ratio of the length to the width is at least 2. In particular, the aspect ratio of the length to the width is no more than 200, preferably no more than 50. The nano- and/or microrods are therefore objects of elongated configuration.

The nano- and/or microrods can each have at least one facet at their tips. The "tip" of the nano- and/or microrod here and below is a region at the end of the nano- and/or microrods facing away from the substrate. For example, the tip extends over at least 1% and no more than 20% of the length of the nano- and/or microrods. The at least one facet can have the shape e.g. of a multi-sided pyramid. It is possible here to define and/or adjust a facet angle formed by the angle between the lateral surfaces and the base surface of the pyramid.

To produce nano- and/or microrods, a core, which extends away from the substrate and is of elongated configuration, is first grown on the substrate. The core can comprise an n-type semiconductor material. The active zone and then a shell, which can be formed using a p-type semiconductor material, are grown on the core, surrounding it. The nano- and/or microrods then have the shape e.g. of elongated rods and/or tubes.

The light passage surface of the semiconductor chip comprises shell surfaces of the nano- and/or microrods. The shell surfaces can be in particular external surfaces of the nano- and/or microrods running along the main extension direction. For example, the shell surfaces are external surfaces of the nano- and/or microrods not covered by the substrate. In particular, the shell surfaces of the nano- and/or microrods can form the light passage surface of the semiconductor chip. In this case, the shell surface can also comprise external surfaces of the facets.

The active zone of nano- and/or microrods can run in three spatial dimensions. Thus, nano- and/or microrods are distinguished by a larger light passage surface compared with an active zone running in only two dimensions. In particular, nano- and/or microrods are capable of emitting a broadband light, preferably in the blue-green range of the electromagnetic spectrum. The spectrum of the broadband light here can have either a single overall maximum or multiple narrowband local maxima.

Owing to strain relaxation resulting from the small dimensions of the nano- and/or microrods, the material quality of the semiconductor layers is improved compared with flat grown semiconductor layers. Furthermore, the cores of the nano- and/or microrods can be almost defect-free. Owing to these low defect densities, in the event that the active zone contains indium, the risk of indium segregation can be reduced even at relatively high indium concentrations. As a result, it is possible to produce even high indium concentrations in the nano- and/or microrods and thus also to provide blue-green light.

According to at least one embodiment of the optoelectronic element, the semiconductor chip comprises as active elements a plurality of nano- and/or microrods, each having the length and the width, wherein the aspect ratio of the length to the width is at least 2 and the light passage surface comprises shell surfaces of the nano- and/or microrods.

Alternatively or in addition, the semiconductor chip can comprise quantum dots as active elements.

According to at least one embodiment of the optoelectronic element, the peak wavelength of the blue-green light is at least 465 nm and no more than 495 nm. The color locus of the blue-green light can in particular have a Cx coordinate in the color space of at least 0.135 and no more than 0.27 and a Cy coordinate in the color space of at least 0.15 and no more than 0.41. The blue-green light thus has a peak wavelength lying between the blue and the green spectral range. In particular, the peak wavelength is a local maximum and/or an overall maximum of the spectrum of the blue-green light. The blue-green light can also have multiple peak wavelengths, each of which is at least 465 nm and no more than 495 nm. In particular, the spectrum of the blue-green light can have an intensity in both the blue and the green spectral ranges of at least 10%, preferably at least 20%, of a full intensity at the at least one peak wavelength.

According to at least one embodiment of the optoelectronic element, the half-width of the spectrum of the blue-green light is at least 60 nm and no more than 90 nm. Here and below, the half-width refers to the full width of the intensity distribution at half intensity (full width at half maximum, FWHM). The blue-green light can also be broadband light which extends over the blue and green spectral ranges.

Alternatively, it is possible that the blue-green light has multiple peak wavelengths, i.e. multiple local and/or overall maxima, wherein a curve with a half-width can be assigned to each peak wavelength. The half-width of each curve is e.g. at least 5 nm and no more than 30 nm, preferably no more than 20 nm. In particular, the blue-green light can have two peak wavelengths, wherein one of the peak wavelengths can lie in the blue spectral range and the other peak wavelength can lie in the green spectral range. An envelope of the maxima of the spectrum of the blue-green light can have a half-width e.g. of at least 60 nm and no more than 90 nm. The blue-green light can have an emission spectrum resembling that of multiple single emitters.

According to at least one embodiment of the optoelectronic element, the active zone of the semiconductor chip is based on GaN. In particular, the active zone contains $In_xGa_{1-x}N$, wherein $0 \leq x \leq 1$. The indium concentration x can be varied along the length of the nano- and/or microrods. Such a variation of the indium concentration can serve to adjust the half-width of the spectrum and/or the peak wavelength of the blue-green light. For example, the indium concentration x can be varied along the length in the range of at least $x=0.1$ to no more than $x=0.35$. It is in particular possible here that the indium concentration decreases continuously or increases continuously along the length. By strongly varying the indium concentration along the length of the nano- and/or microrods, it is possible to shift the peak wavelength of the light emitted by the semiconductor chip from the blue spectral range into the green spectral range. In particular, the half-width of the spectrum of the blue-green light can be increased thereby.

Alternatively or in addition, it is possible that the nano- and/or microrods emit light of a different wavelength at the facets than at the rest of the shell surface which is not part of the facets. For example, the nano- and/or microrods emit green light at the facets and blue light at the rest of the shell surface. In this case, for example, the spectrum of the blue-green light can have at least one peak wavelength in the blue spectral range and one peak wavelength in the green spectral range. The wavelength of the light emitted at the facets can be adjusted e.g. by means of the indium content of the active zone at the tip and/or at the facets. Furthermore, it is possible that owing to varying thicknesses of quantum films in the active zone and/or owing to a differing piezo-electric field in the quantum films, the wavelength of the light emitted at the facets differs from the wavelength of the light emitted at the rest of the shell surface. Because the facet angles of the facets can be predefined, an emission surface of the nano- and/or microrods at the facets is predefined by the width of the nano- and/or microrods. By means of the aspect ratio, therefore, the ratio of the emission surface at the facets and the rest of the shell surface can be adjusted precisely. This allows in particular better control of the spectrum of the blue-green light. For example, the number of maxima, the peak wavelength and/or the half-width of the spectrum can be adjusted.

According to at least one embodiment of the optoelectronic element, the dominant wavelength of the red light is at least 575 nm and no more than 785 nm, preferably at least 580 nm and no more than 640 nm. Alternatively or in addition, the peak wavelength of the red light can be at least 600 nm and no more than 630 nm. The dominant wavelength can be determined from the color diagram. For this purpose, a straight line is drawn through the achromatic point in the color diagram and the measured color locus of the light. The intersection of the straight line with the spectral locus gives the dominant wavelength of the light.

According to at least one embodiment of the optoelectronic element, within the limits of manufacturing tolerances no further wavelength-converting and/or radiation-emitting constituents are contained in the optoelectronic element. In particular, the optoelectronic element then only comprises the red-converting fluorescent particles of one type and the one semiconductor chip. It is therefore possible in particular to provide an optoelectronic element that emits white, preferably warm white, mixed light, in which a single blue-green emitting semiconductor chip and a conversion element with a single type of fluorescent particles, which convert the blue-green light emitted by the semiconductor chip into red light, are present. It is possible in this case that has further wavelength-converting and/or radiation-emitting constituents which do not emit in the visible range of the electromagnetic spectrum. The visible range of the electromagnetic spectrum lies e.g. between at least 380 nm and no more than 780 nm. In other words, the statement that no further wavelength-converting and/or radiation-emitting constituents are present can relate in particular to only the visible range of the electromagnetic spectrum.

According to at least one embodiment of the optoelectronic element, the color temperature of the mixed light varies as a function of the concentration and/or number of fluorescent particles in the conversion element in a range of at least 2000 Kelvin and no more than 10000 Kelvin, preferably at least 3000 Kelvin and no more than 6000 Kelvin. In other words, the color temperature of the mixed light can be adjusted within a range of at least 2000 Kelvin and no more than 10000 Kelvin, preferably at least 3000 Kelvin and no more than 6000 Kelvin, by an appropriate selection of the concentration and/or number of fluorescent particles in the conversion element. The concentration of fluorescent particles in the conversion element can be e.g. the concentration by weight and/or volume of fluorescent particles in the conversion element.

According to at least one embodiment of the optoelectronic element, the color temperature of the mixed light decreases with increasing concentration and/or with increasing number of fluorescent particles in the conversion element. At an elevated concentration and/or number of fluorescent particles in the conversion element, more blue-green light can be converted to red light. In the extreme case, all of the blue-green light can be converted to red light.

According to at least one embodiment of the optoelectronic element, the mixed light covers a 3-step MacAdam ellipse with a black body of the same color temperature. A MacAdam ellipse is an elliptical area in the color diagram around a reference hue, within which area the comparative colours are perceived as equidistant. In the case of coverage within a 3-step MacAdam ellipse, an average test person perceives mixed lights of different colors as being of the same color. The mixed light therefore always has a high similarity to the light emitted by a black body.

According to at least one embodiment of the optoelectronic element, the color rendering index of the mixed light is at least 80. The color rendering index gives the quality of the color rendering of a light source compared with a black body of the same color temperature. In particular, the mixed light can have a color rendering index of at least 80 for each color temperature of the mixed light that can be covered with the optoelectronic element.

According to at least one embodiment of the optoelectronic element, the conversion element is a potting. The potting can comprise a matrix material, into which the fluorescent particles can be introduced. The potting can be arranged in an interstice between the nano- and/or microrods at least in some places. For example, the nano- and/or microrods are arranged on a substrate. It is possible in this case that the main extension directions of the nano- and/or microrods each run vertically to a main extension plane of the substrate. In other words, the nano- and/or microrods are arranged on the substrate in the manner of a plurality of columns. Between each of the nano- and/or microrods, an interstice is then arranged into which the potting can be introduced. The potting covers the shell surfaces of the nano- and/or microrods at least in some places. In particular, the potting can cover at least 70% of the shell surfaces of the nano- and/or microrods.

According to at least one embodiment of the optoelectronic element, the conversion element is a layer which is applied on to the shell surfaces of the nano- and/or microrods at least in some places. For example, the layer can cover at least 70% of the shell surfaces. Furthermore, it is possible that the layer completely covers all of the shell surfaces. The layer can cover the facets at the tip of the nano- and/or microrods, in particular completely. The layer can also be arranged in the interstices between the nano- and/or microrods. The layer can be formed e.g. using a matrix material and/or a plastic. The fluorescent particles can then be introduced into the layer. It is furthermore possible for the layer to consist of the fluorescent particles. In this case, the fluorescent particles can be applied directly on to the shell surfaces, e.g. by electrophoresis.

Furthermore, an optoelectronic component is provided. The optoelectronic component comprises an optoelectronic element as described here. In other words, all of the features disclosed for the optoelectronic element are disclosed for the optoelectronic component and vice versa.

According to at least one embodiment of the optoelectronic component, this comprises an optoelectronic element and a further optoelectronic element. The further optoelectronic element comprises a further semiconductor chip, which emits a blue light during operation and has at least one further light passage surface through which the blue light generated during operation passes. For example, the peak wavelength of the blue light lies within a range of at least 430 nm to no more than 470 nm. The half-width of the spectrum of the blue light can be at least 5 nm and no more than 30 nm. In other words, the blue light can be spectrally pure, narrow-band light.

According to at least one embodiment of the optoelectronic component, the further optoelectronic element additionally comprises a further conversion element which comprises second fluorescent particles. The second fluorescent particles are different from the fluorescent particles of the conversion element. The second fluorescent particles are arranged on the further light passage surface of the further semiconductor chip at least in some places.

According to at least one embodiment of the optoelectronic component, this furthermore comprises an optical element, which superposes components of the mixed light emitted by the optoelectronic element and components of the white further mixed light emitted by the further optoelectronic element to form a white total mixed light. The optical element can be e.g. a prism, a lens, a potting and/or a beam splitter.

According to at least one embodiment of the optoelectronic component, the second fluorescent particles at least partly convert the blue light to a green light. The second fluorescent particles are therefore fluorescent particles that generate photons in the green range of the electromagnetic spectrum when subjected to energetic excitation by blue light. The green range of the electromagnetic spectrum can be the green spectral range. For example, the peak wavelength of the green light is at least 515 nm and no more than 570 nm. The width of the spectrum of the green light can be e.g. at least 5 nm and no more than 70 nm, preferably no more than 50 nm.

The further mixed light contains non-converted components of the blue light and components of the green light. It is furthermore possible that the further conversion element comprises further fluorescent particles, such as e.g. fluorescent particles that emit a deep red light when subjected to energetic excitation. A deep red light has a peak wavelength of e.g. at least 620 nm and no more than 800 nm.

The total mixed light has a higher color rendering index than the mixed light and the further mixed light. In other words, by means of superposing the mixed light and the further mixed light using the optical element, a total mixed light is generated with better quality in terms of color rendering. In particular, two optoelectronic elements can be combined, each of which generates a mixed light efficiently. Thus, for example, using the optoelectronic element, mixed light with a low color temperature can be generated efficiently while the further optoelectronic element efficiently generates mixed light with high color temperatures. The efficiency here and below gives the luminous efficiency of an optoelectronic element in relation to the output of the blue-green or blue light directed into the conversion element. Thus, using an optoelectronic component as described here, total mixed light with a high color rendering index can be generated, the color temperature of which can be adjusted over a wide range.

The optoelectronic element described here and the optoelectronic component described here are explained in more detail below with the aid of exemplary embodiments and the associated figures.

FIGS. 1A and 1B show schematic cross-sectional diagrams of an optoelectronic element as described herein.

FIG. 2 shows a schematic illustration of an optoelectronic component as described herein.

FIG. 3 shows a sketch of the CIE chromaticity diagram.

FIGS. 5A, 5B, 6A, 6B, 7A and 7B show spectra.

Figure 4C:
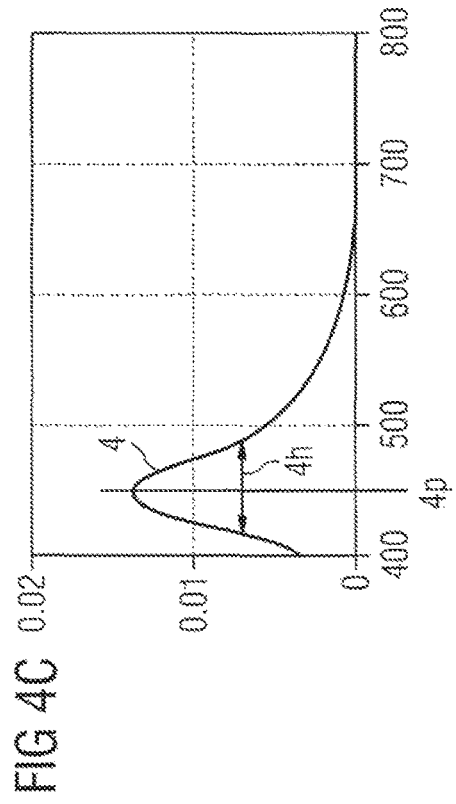
FIGS. 4A, 4B, 4C and 4D show examples of spectra of blue and blue-green light and the color loci that can be achieved using an exemplary red converter material.

Identical, similar or equivalent elements are provided with the same reference numerals throughout the figures. The figures and the size ratios to one another of the elements illustrated in the figures should not be considered as being to scale. Rather, the size of individual elements may be illustrated in an exaggerated size for the purpose of better illustration and/or better understanding.

By means of the cross-sectional diagram of FIG. 1A, an exemplary embodiment of an optoelectronic element as described here is explained in more detail. The optoelectronic element comprises a semiconductor chip 12. The semiconductor chip 12 comprises a substrate 1 having a main extension plane in which the substrate extends in lateral directions, and a top surface 1a. The substrate 1 can be formed e.g. using sapphire, on which further semiconductor layers can be present. On the top surface 1a of the substrate 1, a mask layer 11 is applied. The mask layer 11 is patterned and comprises openings 13.

On the top surface 1a, furthermore, multiple nano- and/or microrods are applied, the lateral dimensions of which are defined by the openings 13 in the mask layer 11. The nano- and/or microrods 2 have a main extension direction, which runs away from the substrate 1. Each nano- and/or microrod 2 has a length 2h and a width 2d. The length 2h of the nano- and/or microrods 2 here is the maximum extension of the nano- and/or microrods 2 along the main extension direction of the nano- and/or microrods 2. The width 2d is the maximum extension of the nano- and/or microrods 2 perpendicular to the length 2h, i.e. in lateral directions. In particular, the width 2d runs along the top surface 1a of the substrate 1. The length 2h of the nano- and/or microrods 2 then runs perpendicular to the top surface 1a of the substrate 1.

The nano- and/or microrods 2 comprise a core 20, an active zone 21 and a shell 22. The core 20 can be formed using e.g. an n-type semiconductor material. The shell 22 is then formed using a p-type semiconductor material. The shell surfaces 2a of the nano- and/or microrods 2 facing away from the substrate 1 form a light passage surface 12a of the semiconductor chip 12. Furthermore, the nano- and/or microrods 2 comprise facets 23 at their tips facing away from the substrate 1.

On the shell surfaces 2a, the conversion element 3 is applied as a layer. Furthermore, the conversion element 3 is arranged in interstices between the nano- and/or microrods 2 at least in some places. The conversion element 3 comprises fluorescent particles 31. The fluorescent particles 31 can be introduced into the conversion element 3 and distributed therein. In contrast to what is shown in the figures, it is furthermore possible that the conversion element 3 consists of the fluorescent particles 31.

During operation, the semiconductor chip 12 emits a blue-green light 4. Upon energetic excitation of the fluorescent particles 31 by the blue-green light 4, the blue-green light 4 is at least partly converted to red light 5. Components of the red light 5 and non-converted components of the blue-green light 4 then form a white mixed light 6, which is emitted by the optoelectronic element.

With the aid of the schematic cross-sectional diagram of FIG. 1B, a further exemplary embodiment of an optoelectronic element as described here is explained in more detail. The exemplary embodiment illustrated differs from that of FIG. 1A only through the fact that the conversion element 3 is present as a potting. The fluorescent particles 31 are introduced into the potting. The potting can be formed using a matrix material, such as e.g. a silicone and/or an epoxy resin. The conversion element 3 is arranged in interstices between the nano- and/or microrods 2 at least in some places. In particular, the conversion element 3 at least partly covers the shell surfaces 2a.

With the aid of the schematic cross-sectional diagram of FIG. 2, an optoelectronic component as described here is explained in more detail. The optoelectronic component comprises an optoelectronic element with a semiconductor chip 12 and a conversion element 3, which generates a white mixed light 6. Furthermore, the optoelectronic component comprises a further semiconductor chip 91 with a further light passage surface 91a, which emits a blue light 81, and a further conversion element 92, which is arranged on the light passage surface 91a of the further semiconductor chip 91. The further conversion element 92 comprises second fluorescent particles 94, which convert the blue light 81 to a green light 82. As a result of this, a further mixed light 8 is generated, which comprises components of the green light 82 and non-converted components of the blue light 81.

The optoelectronic component furthermore comprises an optical element 93. The optical element 93 in the present case is a lens, which is in the form of a potting. The optical element 93 superposes the mixed light 6 and the further mixed light 8 to form a total mixed light 83. The total mixed light 83 then comprises components of the blue-green light 4, components of the red light 5, components of the blue light 81 and components of the green light 82. As a result, a white total mixed light 83 with a high color rendering index can be provided.

With the aid of the sketched CIE chromaticity diagram of FIG. 3, the way in which an optoelectronic element as described here works is explained in more detail. The color space that can be spanned by the optoelectronic element is illustrated in more detail here. On the horizontal axis, the relative red content Cx is shown, while the vertical axis shows the relative green content Cy. With the semiconductor chip 12, a color locus 41 in the green-blue range of the color diagram can be covered. The color locus 41 of the blue-green light 4 lies on a connecting line 4c between a point 42 in the green range of the spectral color line, which contains the pure spectral colours, and a point 43 in the blue range of the spectral color line. With the fluorescent particles 31, a color locus 51 in the red range of the spectral color line can be covered.

By modifying the concentration and/or number of fluorescent particles 31 in the conversion element 3, the color can be modified along the concentration line 5c. Where the concentration line 5c intersects the Planck curve 61, an optimum mixed light 6 is obtained with a high color rendering index.

Figure 4D:
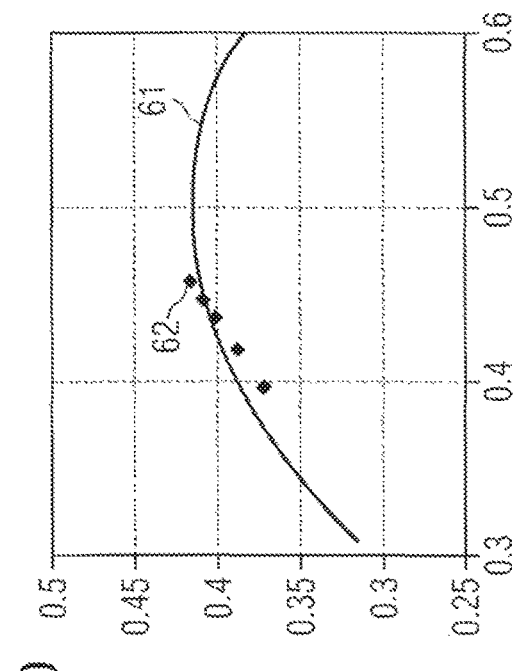
Figure 4A:
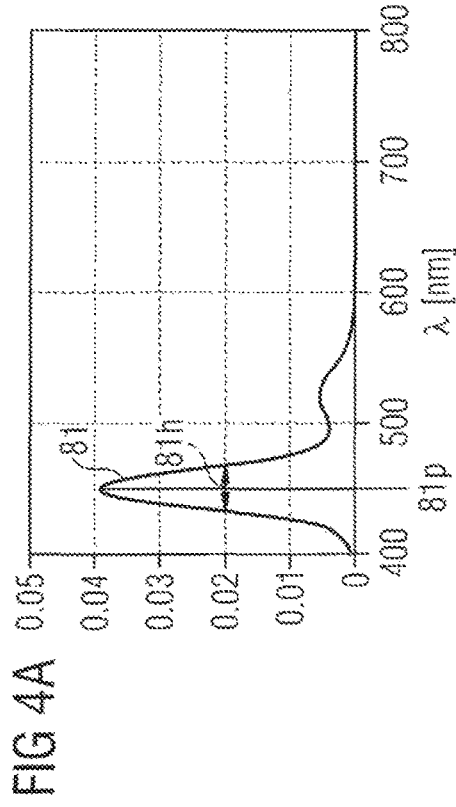
Figure 4B:
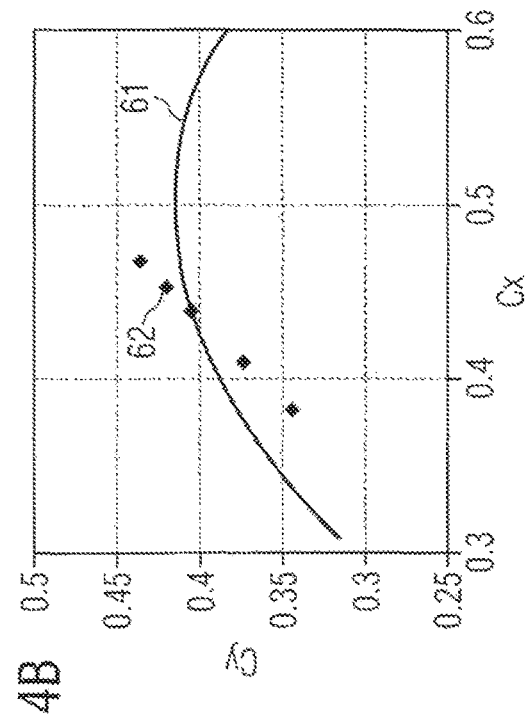

With the aid of the spectra of FIGS. 4A and 4C and the associated extracts from the CIE chromaticity diagram of FIGS. 4B and 4D, a way in which an optoelectronic element as described here works is explained in more detail. FIG. 4A shows a spectrum of a blue light 81 with a peak wavelength $81p$ in the range of at least 440 nm and no more than 470 nm and a half-width $81h$ in the range of at least 5 nm and no more than 30 nm. Here and below, spectra are each plotted as intensity in arbitrary units (a.u.) as a function of the wavelength $\lambda$ in nm.

With the blue light 81 in conjunction with a conversion element 3, a mixed light 6 is generated. The color loci 62 that can be achieved with a blue light 81 and a red light 5 are plotted in FIG. 4B. The color loci 62 deviate markedly from the Planck curve 61. The greater the distance of the color loci 62 from the Planck curve 61, the lower the color rendering index of the mixed light 6. Thus, a mixed light 6 with only a blue light 81 has a low color rendering index.

FIG. 4C shows a spectrum of a blue-green light 4 with a half-width of at least 50 nm and a peak wavelength of at least 430 nm and no more than 490 nm. FIG. 4D shows achievable color loci 62 of the mixed light 6 of the blue-green light 4 and a red light 5. The achievable color loci 62 are substantially closer to the Planck curve 61 compared with FIG. 4B. With a blue-green emitting semiconductor chip 12, therefore, a large region of the Planck curve 61 can be covered with a high color rendering index.

With the aid of the spectra 701, 702, 703, 704, 705, 706, 707, 708, 709, 710, 711 of FIG. 5A, a further exemplary embodiment of an optoelectronic element as described here is explained in more detail. A first spectrum 701 of a blue-green light 4 emitted by the semiconductor chip 12 during operation and a second to an eleventh spectrum 702, 703, 704, 705, 706, 707, 708, 709, 710, 711 for mixed light 6 that can be generated using the optoelectronic element are shown here. The respective spectra 701, 702, 703, 704, 705, 706, 707, 708, 709, 710, 711 have the color space assigned in the table in FIG. 5B, given by the coordinates Cx and Cy in the color diagram. Here, the concentration of the fluorescent particles 31 in the conversion element 3 is increased as the numbers go up from the second to the eleventh spectrum 702, 703, 704, 705, 706, 707, 708, 709, 710, 711. Thus, for example, an optoelectronic element assigned to the third spectrum 703 has a lower concentration of fluorescent particles 31 in the conversion element 3 than e.g. an optoelectronic element assigned to the fifth spectrum 705.

In the exemplary embodiment shown in FIGS. 5A and 5B, a semiconductor chip 12 is used, which emits a blue-green light 4 with a peak wavelength $4p$ in the range of 478 nm to 490 nm, preferably 482 nm to 486 nm. The first spectrum 701 here only has one maximum at the peak wavelength $4p$. The half-width $4h$ of the spectrum 701 of the blue-green light 4 in the exemplary embodiment shown is at least 60 nm and no more than 80 nm, preferably at least 65 nm and no more than 75 nm. The color locus 41 of the blue-green light 4 is e.g. Cx=0.145 and Cy=0.250 (see also FIG. 5B).

When a conversion element 3 is added with different concentrations of fluorescent particles, for example the second to eleventh spectra 702, 703, 704, 705, 706, 707, 708, 709, 710, 711 are formed. A second maximum is formed in the red range of the electromagnetic spectrum. This maximum can be assigned to the peak wavelength of the red light 5 generated by the fluorescent particles 31.

In the exemplary embodiment of FIGS. 5A and 5B, e.g. fluorescent particles 31 with a solid state color locus in the range of Cx=0.58 to Cx=0.63 and Cy=0.365 to Cy=0.42 are used. The solid state color locus here and below is the color locus 51 of the red light 5 obtained using a conversion element 3 which only powdered fluorescent particles 31 that are compressed in the form of a tablet, in conjunction with the narrow-band blue light 81 with a peak wavelength at 450 nm. In particular, the solid state color locus corresponds to the saturated color locus 51 of the red light 5. In other words, an addition of further fluorescent particles 31 to the conversion element 3 does not lead to a modification of the color locus 51 of the red light 5.

In particular, the red light 5 that is generated in the exemplary embodiment of FIGS. 5A and 5B has a peak wavelength 5p in the range of at least 605 nm and no more than 620 nm, preferably at least 613 nm and no more than 617 nm. Furthermore, the dominant wavelength of the red light 5 can be at least 590 nm and no more than 605 nm, preferably at least 595 nm and no more than 599 nm. Furthermore, the half-width 5h of the red light 5 can be at least 80 nm and no more than 90 nm. The half-width 5h of the red light 5 can be determined e.g. with the aid of the right-hand maximum of the second to eleventh spectra 702, 703, 704, 705, 706, 707, 708, 709, 710, 711.

As the concentration of the fluorescent particles 31 in the conversion element 3 rises, i.e. as the numbering of the spectra 702, 703, 704, 705, 706, 707, 708, 709, 710, 711 goes up, an increase in the red content of the mixed light 6 is obtained. In particular, mixed light 6 that runs close to the Planck curve 61 in the color diagram can be generated here. The mixed light 6 assigned to the spectra 702, 703, 704, 705, 706, 707, 708, 709, 710, 711 has a color temperature in the range of at least 3000 K and no more than 5500 K. The respective mixed light 6 can have a color rendering index of no more than 80.

With the aid of the spectra 701, 702, 703, 704, 705, 706, 707, 708, 709, 710, 711 of FIG. 6A, with the associated color loci in FIG. 6B, a further exemplary embodiment of an optoelectronic element as described here is explained in more detail. The exemplary embodiment of FIGS. 6A and 6B differs from that of FIGS. 5A and 5B through the selection of the peak wavelength 4p of the blue-green light 4 and the peak wavelength 5p of the red light 5 as explained in more detail below.

The peak wavelength 4p of the blue-green light 4 is at least 472 nm and no more than 484 nm, preferably at least 476 nm and no more than 480 nm. The half-width 4h of the spectrum 701 of the blue-green light 4 in the exemplary embodiment shown is at least 70 nm and no more than 90 nm, preferably at least 77 nm and no more than 87 nm. The color locus 41 of the blue-green light 4 is e.g. Cx=0.153 and Cy=0.222 (see also FIG. 6B).

The peak wavelength 5p of the red light 5 in the exemplary embodiment of FIGS. 6A and 6B is at least 600 nm and no more than 616 nm, preferably at least 606 nm and no more than 610 nm. Furthermore, the dominant wavelength of the red light 5 can be at least 587 nm and no more than 601 nm, preferably at least 590 nm and no more than 598 nm. Furthermore, the half-width 5h of the red light 5 can be at least 70 nm and no more than 90 nm, preferably at least 77 nm and no more than 87 nm. To achieve the aforementioned values, e.g. fluorescent particles 31 with a solid state color locus in the range of Cx=0.57 to Cx=0.62 and Cy=0.375 to Cy=0.425 are suitable.

The mixed light 6 of the exemplary embodiment of FIGS. 6A and 6B can in each case have a color rendering index of at least 80. Thus, high-quality mixed light 6 can be provided.

Figure 7A:
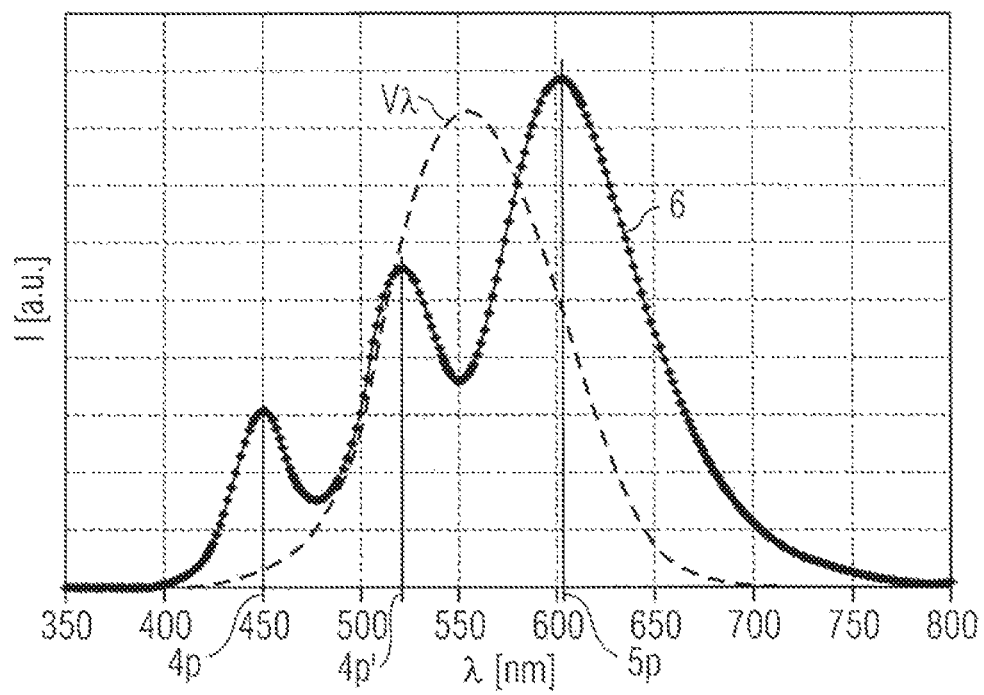
Figure 7B:
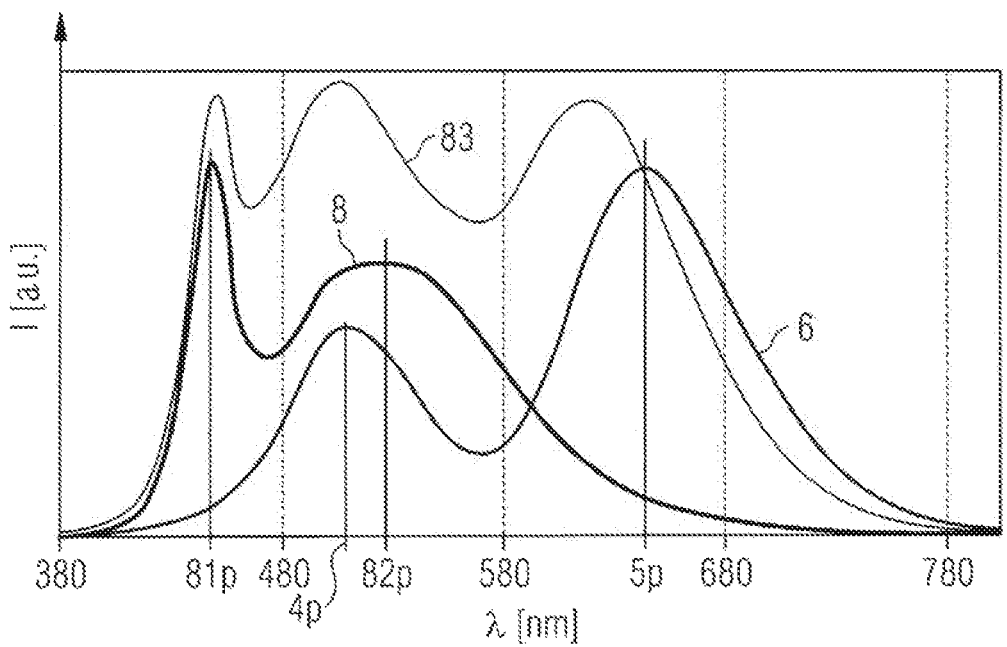

With the aid of the spectra of FIGS. 7A and 7B, a manner of functioning of an optoelectronic element as described here and an optoelectronic component as described here is explained in more detail.

FIG. 7A shows a spectrum of the mixed light 6, which is composed of components of the blue-green light 41 and of the red light 5, and the light sensitivity curve Vλ of the human eye. The mixed light 6 has three local maxima 4p, 4p', 5p, which can be assigned to the peak wavelength 5p of the red light 5 and peak wavelengths 4p, 4p' of the blue-green light 4. The blue-green light 4 has two peak wavelengths 4p, 4p', which lie within the blue-green range of the electromagnetic spectrum. The first peak wavelength 4p of the blue-green light 4 lies within the range of at least 440 nm and no more than 460 nm, while the second peak wavelength 4p' of the blue-green light 4 lies within the range of 520 nm to 550 nm. By means of a convolution of the spectrum of the mixed light 6 with the light sensitivity curve Vλ, the quality of the color rendering of the mixed light 6 can be determined.

FIG. 7B shows the spectrum of the mixed light 6, the spectrum of the further mixed light 8 and the spectrum of the total mixed light 83. The peak wavelength 81p of the component of the blue light 81 contained in the spectrum of the further mixed light 8, which lies within the range of at least 420 nm and no more than 450 nm, can clearly be seen here. Furthermore, the peak wavelength 82p of the component of the green light 82 contained in the spectrum of the further mixed light 8, which lies within the range of at least 500 nm and no more than 560 nm, is visible.

Moreover, in the spectrum of the mixed light 6 the peak wavelength 4p of the blue-green light and the peak wavelength 5p of the red light 5 can be seen.

As a result of the superposition of the mixed light and the further mixed light 8, the spectrum of the total mixed light 83 is obtained, which contains all of the constituents of the mixed light 6 and of the further mixed light 8. The total mixed light 83 has a higher color rendering index than the mixed light 6 and the further mixed light 8. In particular, the total mixed light 83 has a high intensity in the wavelength ranges between at least 400 nm and no more than 600 nm.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The work on which this application is based was funded by the European Union under the funding code NMP3-SL-2012-280694.

The present patent application claims the priority of the German patent application DE 10 2014 117 892.0, the disclosure content of which is incorporated herein by reference.

LIST OF REFERENCE NUMERALS

1 Substrate
1a Top surface
11 Mask layer
12 Semiconductor chip
12a Light passage surface
13 Openings
2 Nano-/microrods
20 Core
21 Active zone
22 Shell
24 Facets
2a Shell surfaces
2d Width of nano-/microrods 2h Length of nano-/microrods
3 Conversion element
31 Fluorescent particles
4 Blue-green light
4p Peak wavelength of blue-green light
4d Dominant wavelength of blue-green light
4h Half-width of spectrum of blue-green light
4c Connecting line
41 Color locus of blue-green light
42 Green spectral point
43 Blue spectral point
5 Red light
5p Peak wavelength of red light
5h Half-width of spectrum of red light
5c Concentration curve of fluorescent particles
51 Color locus of red light
6 Mixed light
61 Planck curve
62 Achievable color locus of mixed light
701 Spectrum of blue-green light
702, 703, 704, 705, 706, 707, 708, 709, 710, 711 second to eleventh spectrum
8 Further mixed light
81 Blue light
81p Peak wavelength of blue light
81h Half-width of spectrum of blue light
82 Green light
82p Peak wavelength of green light
83 Total mixed light
91 Further semiconductor chip
91a Further light passage surface
92 Further conversion element
93 Optical element
94 Second fluorescent particles
Vλ Light sensitivity curve of the human eye

The invention claimed is:

1. An optoelectronic component comprising:
an optoelectronic element comprising:
a semiconductor chip that emits a blue-green light during operation and has at least one light passage surface through which the blue-green light emitted during operation passes; and
a conversion element that comprises fluorescent particles and is arranged on the light passage surface at least in some places,
wherein the fluorescent particles at least partly convert the blue-green light to a red light,
wherein the optoelectronic element emits a white mixed light that contains non-converted components of the blue-green light and components of the red light,
wherein a half-width of the spectrum of the blue-green light is at least 60 nm,
wherein the semiconductor chip contains as active elements a plurality of nano- and/or microrods, and the nano- and/or microrods comprise a core, an active zone and a shell,
wherein the active zone of the semiconductor chip is formed using $In_xGa_{1-x}N$, and
wherein an indium concentration x varies along a length of the nano- and/or microrods to adjust a peak wavelength and/or the half-width, and
a further optoelectronic element comprising:
a further semiconductor chip that emits a blue light during operation and has at least one further light passage surface through which the blue light generated during operation passes, and
a further conversion element that comprises second fluorescent particles that differ from the fluorescent particles of the conversion element, and is arranged on the further light passage surface at least in some places; and
an optical element that superposes components of the white mixed light emitted by the optoelectronic element and components of a white further mixed light emitted by the further optoelectronic element to form a white total mixed light,
wherein the second fluorescent particles at least partly convert the blue light to a green light,
wherein the white further mixed light contains non-converted components of the blue light and the green light, and
wherein the total mixed light has a higher color rendering index than the mixed light and the further mixed light.

2. The optoelectronic element according to claim 1, wherein the nano- and/or microrods each have a length and a width,
wherein an aspect ratio of the length to the width is at least 2, and
wherein the light passage surface comprises shell surfaces of the nano- and/or microrods.

3. The optoelectronic element according to claim 1, wherein a peak wavelength of the blue-green light is at least 465 nm and no more than 495 nm.

4. The optoelectronic element according to claim 1, wherein the half-width of the spectrum of the blue-green light is no more than 90 nm.

5. The optoelectronic element according to claim 1, wherein a dominant wavelength of the red light is at least 575 nm and no more than 785 nm and/or a peak wavelength of the red light is at least 600 nm and no more than 630 nm.

6. The optoelectronic element according to claim 1, wherein a color temperature of the white mixed light varies within a range of at least 2400 K and no more than 6500 K as a function of a concentration and/or a number of fluorescent particles in the conversion element.

7. The optoelectronic element according to claim 6, wherein the color temperature of the white mixed light decreases with increasing concentration and/or number of fluorescent particles in the conversion element.

8. The optoelectronic element according to claim 1, wherein the white mixed light covers a 3-step MacAdam ellipse with a black body of a same color temperature.

9. The optoelectronic element according to claim 1, wherein a color rendering index of the white mixed light is at least 80.

10. The optoelectronic element according to claim 1, wherein the conversion element is a potting that is arranged in an interstice between the nano- and/or microrods at least in some places and at least partly covers shell surfaces of the nano- and/or microrods.

11. The optoelectronic element according to claim 1, wherein the conversion element is a layer that is applied on shell surfaces of the nano- and/or microrods at least in some places.

12. An optoelectronic element comprising:
a semiconductor chip that emits a blue-green light during operation and has at least one light passage surface through which the blue-green light emitted during operation passes; and
a conversion element that comprises fluorescent particles and is arranged on the light passage surface at least in some places, wherein the fluorescent particles at least partly convert the blue-green light to a red light, wherein the optoelectronic element emits a white mixed light that contains non-converted components of the blue-green light and components of the red light, wherein a half-width of the spectrum of the blue-green light is at least 60 nm, wherein the semiconductor chip contains as active elements a plurality of nano- and/or microrods, and the nano- and/or microrods comprise a core, an active zone and a shell, and wherein the nano- and/or microrods each have at least one facet at their tips, the conversion element is a layer that is applied on shell surfaces of the nano- and/or microrods at least in some places and the layer covers the facets at the tip of the nano- and/or microrods.

13. The optoelectronic element according to claim 1, the conversion element comprises fluorescent particles of only one type.

* * * * *